United States Patent [19]

Beckett

[11] Patent Number: 4,938,990

[45] Date of Patent: Jul. 3, 1990

[54] PATTERN METALLIZING

[75] Inventor: Donald G. Beckett, Acton, Canada

[73] Assignee: Beckett Packaging Limited, Oakville, Canada

[21] Appl. No.: 322,287

[22] Filed: Mar. 13, 1989

[30] Foreign Application Priority Data

Mar. 11, 1988 [GB] United Kingdom ............... 8805860

[51] Int. Cl.⁵ ........................... B05D 5/00; B05D 1/00
[52] U.S. Cl. ....................................... 427/14.1; 427/25
[58] Field of Search ................. 427/14.1, 25; 118/644, 118/651, 653, 648, 720, 624

[56]  References Cited

U.S. PATENT DOCUMENTS

| 2,097,233 | 10/1937 | Meston ..................... | 427/14.1 X |
| 3,697,238 | 10/1972 | Brown et al. .............. | 427/25 X |
| 4,656,964 | 4/1987 | Kanno et al. .............. | 118/651 X |

Primary Examiner—Evan Lawrence
Attorney, Agent, or Firm—Sim & McBurney

[57]  ABSTRACT

A pattern metallizing procedure is described wherein aluminum or other metal is deposited in a desired pattern on a polymeric material or other material web. The metal is charged with one polarity while a backing roll contacting the web is provided with regions charged with the opposite polarity to attract metal and with regions charged with the same polarity to repulse metal.

5 Claims, 1 Drawing Sheet

PATTERN METALLIZING

FIELD OF THE INVENTION

The present invention relates to pattern metallizing of substrates.

BACKGROUND OF THE INVENTION

The provision of thin metal films on polymeric material webs by vapour deposition, usually of aluminum, is well known. The polymeric film passes continuously through a vacuum chamber containing the metal vapor, which deposits on one surface of the film.

It has previously been described by Donald E. Beckett in U.S. Pat. Nos. 4,398,994, 4,556,614 and 4,610,755 to form decorative patterns on metallized polymeric films by selective demetallization of the aluminum using a suitable aqueous etchant. Details of the procedures used are set forth in the above-noted patents.

While the prior art selective demetallizing processes successfully produce patterned films for packaging and other purposes, it is necessary to remove metal previously applied to the substrate using chemical etchants, thereby incurring a considerable material cost.

SUMMARY OF THE INVENTION

In accordance with the present invention, there is provided a novel method of providing a patterned substrate which involves direct metallizing of the desired pattern on the substrate surface. As far as I am aware, this result has not previously been achieved in a continuous process.

The prior art has suggested the use of masks or the like to prevent deposition of metal on selected areas of a substrate. The use of such masks does not involve any saving in metal, since the metal simply deposits on the mask instead of the substrate. In addition, masking is suitable only for discontinuous batch operation.

In the present invention, I employ the selective application of electrostatic charges to produce the required pattern of deposition on the desired substrate.

GENERAL DESCRIPTION OF THE INVENTION

Figure 1:
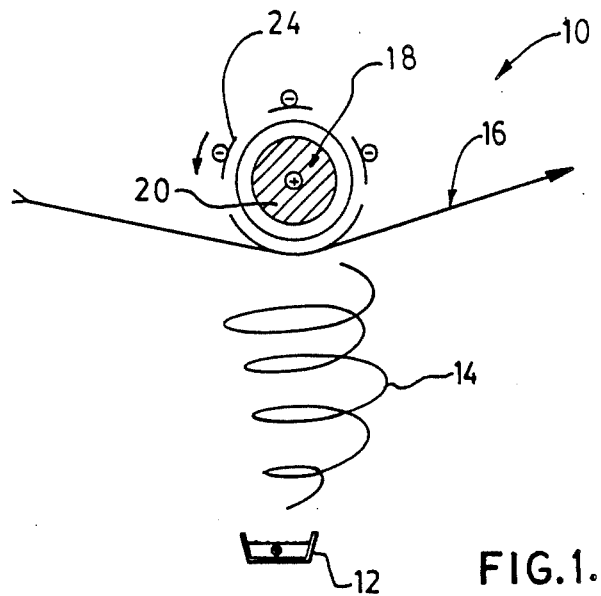
FIG. 1 is a side-elevational schematic view of apparatus to achieve pattern metallizing in accordance with one embodiment of the invention.
Figure 2:
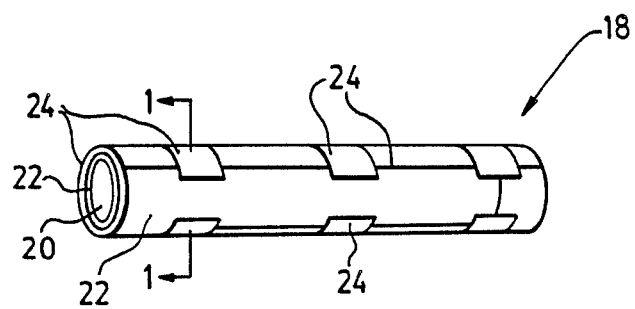
FIG. 2 is a perspective view of the backing roller used in the apparatus of FIG. 1.

The invention is described with respect to its specific embodiment in connection with the continuous application of aluminum to a polymeric material web. However, the principles of the invention are of more general application, so that a pattern of any electrostatically-influenceable material may be formed on any desired substrate in continuous or discontinuous operation.

The manner of provision of the electrostatic field and its manipulation to achieve deposition of the desired pattern of material on the substrate surface depends, to some extent, on the nature of the material to be deposited and of the substrate onto which it is to be deposited. Generally, however, one electrostatic charge pole is associated with a source of the material to be deposited, the opposite electrostatic charge pole is associated with the substrate in the areas onto which the material is to be deposited and the same electrostatic charge pole also is associated with the substrate in the areas onto which the material is not to be deposited, whereby electrostatic attraction causes deposition of material in the desired portions of the substrate and electrostatic repulsion prevents deposition of the material elsewhere on the substrate so that the desired pattern is provided.

In a preferred embodiment of the invention, aluminum or other vaporizable material is vapor deposited on a web of polymeric material. A rotating backing roller, contacting the side of the web opposite to that on which the aluminum is deposited, is employed to provide selective electrostatic attracting and repulsing charges across the width of the web while the source of the aluminum vapor is provided with an electrostatic charge.

DESCRIPTION OF PREFERRED EMBODIMENT

Referring to the drawings, a pattern metallizing apparatus 10 includes a source of aluminum 12 which is heated to vaporize the same and form a vapor 14, usually within an enclosed chamber. The source of aluminum 12 is electrostatically charged with one pole, positive in the illustrated embodiment.

A web 16 of polymeric material passes through the apparatus with one surface exposed to the aluminum vapor 14. A backing roll 18 is provided in contact with the opposite side of the web 16. The backing roll 18 has an electroconductive central core 20 which is charged with the same electrostatic pole as the source of aluminum, again positive.

The central core 20, which may be constructed, for example, of steel, has a coating of electrically-insulating material 22, such as Teflon, and the outer surface of the roll 18 has selected zones 24 of electroconductive material, which are charged oppositely to the core 20 and hence to the vaporized metal 14. The outer zones or strips 24 are provided in the pattern desired to be formed on the web 16 and may be constructed of any desired conductive material, such as chrome.

As the web 16 moves through the apparatus 10 and the roller 18 rotates, aluminum is selectively deposited as a thin film only in the regions of attraction of the electrostatic charges, i.e., in the regions of the negatively-charged strips 24, while the positive charge of the core 20 prevents deposition elsewhere. In this way, the web 16 is selectively metallized directly in a desired pattern with minimum usage of a metallizing material.

The patterned web which results may be used in a variety of applications, for example, in various packaging applications, as described in the above-noted U.S. patents.

SUMMARY OF DISCLOSURE

In summary of this disclosure, I have provided a novel method of providing a pattern on a substrate surface using electrostatic deposition. Modifications are possible within the scope of this invention.

What I claim is:

1. A method of providing a substrate metallized in a desired pattern, which comprises:
   providing a metal in depositable form,
   electrostatically charging said metal with one polarity,
   electrostatically charging said substrate to provide regions corresponding to said desired pattern of the opposite polarity to said one polarity, thereby to attract metal to said substrate and to deposit thereon said pattern, and to provide regions of the same polarity as said one polarity to repulse metal from deposition therein.

2. The method of claim 1 wherein said substrate is a continuously-moving web and said metal is vaporized for deposition on said web.

3. The method of claim 2 wherein said electrostatic charging of said substrate is effected by employing a rotating backing roller contacting a side of said web opposite to that on which said metal is deposited and dimensioned to extend for the width of said web.

4. The method of claim 3 wherein said backing roller has first surface regions which are charged with said opposite polarity and second surface regions between said first surface regions which are charged with said one polarity, so as to provide selective electrostatic attracting and repulsing charges across the web.

5. The method of claim 4 wherein said web is polymeric material web and said metal is aluminum.

* * * * *